United States Patent
Donner et al.

(10) Patent No.: US 11,959,963 B2
(45) Date of Patent: Apr. 16, 2024

(54) INTEGRITY TESTS FOR MIXED ANALOG DIGITAL SYSTEMS

(71) Applicant: Aptiv Technologies AG, Schaffhausen (CH)

(72) Inventors: Olaf Donner, Harsum (DE); Tammo Kunnert, Hildesheim (DE)

(73) Assignee: Aptiv Technologies AG, Schaffhausen (CH)

( * ) Notice: Subject to any disclaimer, the term of this patent is extended or adjusted under 35 U.S.C. 154(b) by 0 days.

(21) Appl. No.: 18/064,499

(22) Filed: Dec. 12, 2022

(65) Prior Publication Data

US 2023/0258712 A1 Aug. 17, 2023

Related U.S. Application Data

(60) Provisional application No. 63/268,055, filed on Feb. 15, 2022.

(30) Foreign Application Priority Data

Mar. 14, 2022 (EP) ..................................... 22161941

(51) Int. Cl.
*G01R 31/316* (2006.01)
*G01R 31/00* (2006.01)
*G01R 31/3167* (2006.01)

(52) U.S. Cl.
CPC ....... *G01R 31/3167* (2013.01); *G01R 31/007* (2013.01)

(58) Field of Classification Search
CPC .......................... G01R 31/3167; G01R 31/007
See application file for complete search history.

(56) References Cited

U.S. PATENT DOCUMENTS 4,566,093 A * 1/1986 Diaz ..................... H04M 3/244
379/22.03
4,667,296 A * 5/1987 Crowe ............... G01R 31/2837
341/118

(Continued)

FOREIGN PATENT DOCUMENTS

CN 1543724 A 11/2004
CN 104509017 A 4/2015

(Continued)

OTHER PUBLICATIONS

"Extended European Search Report", EP Application No. 18214279.4, dated Jun. 28, 2019, 8 pages.

(Continued)

*Primary Examiner* — Mohamed Charioui
*Assistant Examiner* — Lynda Dinh
(74) *Attorney, Agent, or Firm* — Harness, Dickey & Pierce, P.L.C.

(57) ABSTRACT

Device for checking the integrity of a digital transmission for an analog output of a system. The analog output may be checked for transient errors that can be attributed to a digital transmission path embedded somewhere within the vehicle system. A test signal is introduced into a digital transmission that can be reassembled from an analog path of the analog output, and, if not, allows the test device to pinpoint that errors are appearing due to the digital path, and not because of the analog output. In this way, debugging an installation of a system becomes easier; obtaining confidence in reliability of a mixed analog and digital system becomes less of a challenge and less time consuming.

20 Claims, 5 Drawing Sheets

(56) References Cited

U.S. PATENT DOCUMENTS

| | | | |
|---|---|---|---|
| 4,796,287 A * | 1/1989 | Reesor | H04Q 1/453 |
| | | | 379/390.03 |
| 5,826,227 A | 10/1998 | Jayant | |
| 6,832,206 B1 * | 12/2004 | Chelnik | G06Q 10/087 |
| | | | 235/31 R |
| 6,999,983 B2 * | 2/2006 | Suzuki | H04J 13/10 |
| | | | 708/250 |
| 8,274,296 B2 * | 9/2012 | Kawabata | G01R 31/3167 |
| | | | 341/126 |
| 8,627,156 B1 | 1/2014 | Erickson | |
| 8,671,745 B2 * | 3/2014 | Deurloo | G01M 13/02 |
| | | | 73/115.03 |
| 9,591,422 B2 * | 3/2017 | Kechichian | H04R 3/002 |
| 11,088,781 B2 | 8/2021 | Donner | |
| 2002/0168017 A1 | 11/2002 | Berthet et al. | |
| 2006/0200708 A1 | 9/2006 | Gentieu et al. | |
| 2008/0123749 A1 | 5/2008 | Bretillon et al. | |
| 2009/0033528 A1 * | 2/2009 | Kimura | H03M 1/109 |
| | | | 341/120 |
| 2011/0299581 A1 | 12/2011 | Le-Gall | |
| 2012/0137016 A1 | 5/2012 | Hsu et al. | |
| 2013/0293725 A1 | 11/2013 | Zhang et al. | |
| 2014/0143619 A1 | 5/2014 | Gorman et al. | |
| 2014/0223229 A1 * | 8/2014 | Ozer | G06F 11/076 |
| | | | 714/37 |
| 2016/0306976 A1 | 10/2016 | Gantman et al. | |
| 2017/0019247 A1 | 1/2017 | Iyer et al. | |
| 2017/0078032 A1 | 3/2017 | Olgaard et al. | |
| 2017/0303009 A1 * | 10/2017 | Nakamura | H04N 21/233 |
| 2017/0303015 A1 * | 10/2017 | Herges | G08C 25/00 |
| 2019/0139399 A1 | 5/2019 | Chellappan et al. | |
| 2019/0266331 A1 | 8/2019 | Diaz et al. | |
| 2020/0204297 A1 | 6/2020 | Donner | |
| 2021/0232691 A1 | 7/2021 | Bishop et al. | |

FOREIGN PATENT DOCUMENTS

| | | |
|---|---|---|
| CN | 104541469 A | 4/2015 |
| CN | 111343038 A | 6/2020 |
| EP | 3672135 A1 | 6/2020 |
| EP | 3672135 B1 | 8/2022 |
| FR | 3003114 A1 * | 9/2014 |

OTHER PUBLICATIONS

"Extended European Search Report", EP Application No. 22161941.4, dated Sep. 7, 2022, 8 pages.

"Extended European Search Report", EP Application No. 23153309.2, dated Jun. 15, 2023, 6 pages.

* cited by examiner

US 11,959,963 B2

INTEGRITY TESTS FOR MIXED ANALOG DIGITAL SYSTEMS

CROSS-REFERENCE TO RELATED APPLICATIONS

This application claims priority to European Patent Application Number 22161941.4, filed Mar. 14, 2022, which claims priority to U.S. Provisional Patent Application No. 63/268,055, filed Feb. 15, 2022, the disclosures of which are hereby incorporated by reference in its entirety herein.

BACKGROUND

Some vehicle systems (e.g., a warning system, infotainment system, a user interface device) generate information for output to acoustical components. Digitized audio information is propagated over digital transmissions within these systems for eventual output as analog signals or sounds. These digital transmissions can encounter faults or introduce transient errors, which can propagate at intermittent or unpredictable times. Errors may be caused by many issues, and when present in an audio output, they can be unpleasant and impact driving safety if they cause distractions or mask other simultaneous warnings (e.g., chimes or announcement). Integrity checks can be performed to check whether a purely digital transmission path is inducing errors in an output. However, these techniques may not be suitable for checking mixed systems having digital and analog transmission paths, or they may be too expensive or time consuming for many validation tasks. Several days of computer simulation, and months or years of real-world road driving are not acceptable ways to verify integrity of an output from a mixed digital and analog system.

SUMMARY

This summary introduces simplified concepts related to integrity tests for mixed analog digital systems, as further described in the Detailed Description and conveyed by the Drawings. In one example, at least one processor of a device is configured to check integrity of a digital transmission for an analog output of a system and output an indication of whether any errors are introduced by a digital path of the digital transmission, as opposed to an analog path of the analog output. To check the integrity, a test signal produced from a first test signal generator (TSG), for example, a pseudo random number generator (PRNG), of the system or device being tested is estimated. The test signal is injected into the digital transmission that is output on an analog path of the analog output. Then, all without direct access to the digital transmission, to estimate the test signal, a second TSG that relies on a same test signal generation function as the first TSG is used. The second TSG is compensated, however, for a linear transfer function of the digital path of the digital transmission and the analog path of the analog output combined. Whether the estimated test signal is identifiable from the analog path of the analog output enables the at least one processor to determine if the digital path of the digital transmission is free from errors. An indication of whether any errors, including transient or static (e.g., faults), are introduced by the digital path of the digital transmission may be output. This indication can be used downstream by a warning system, infotainment system, vehicle controller, or other actor of a vehicle that may execute operations to account for, or act, based on digital transmissions that may have been corrupted.

This summary is not intended to identify essential features of the claimed subject matter, nor is it intended for use in determining the scope of the claimed subject matter. Although primarily described in the context of integrity tests for mixed analog digital systems in vehicles, the techniques for integrity tests for mixed analog digital systems, as described herein, can be applied to other applications where signal integrity and reliability are as important as processing speed, such as, computer technology, information technology, communications and mobility technology, industrial technology, manufacturing technology, power production technology, other vehicles including airplanes and marine craft, and other systems.

BRIEF DESCRIPTION OF THE DRAWINGS

The details of one or more aspects of integrity tests for mixed analog digital systems are described in this document with reference to the Drawings, in which same numbers are used throughout the figures to indicate like components, and which are briefly described as follows.

DETAILED DESCRIPTION

Introduction

Figure 1:
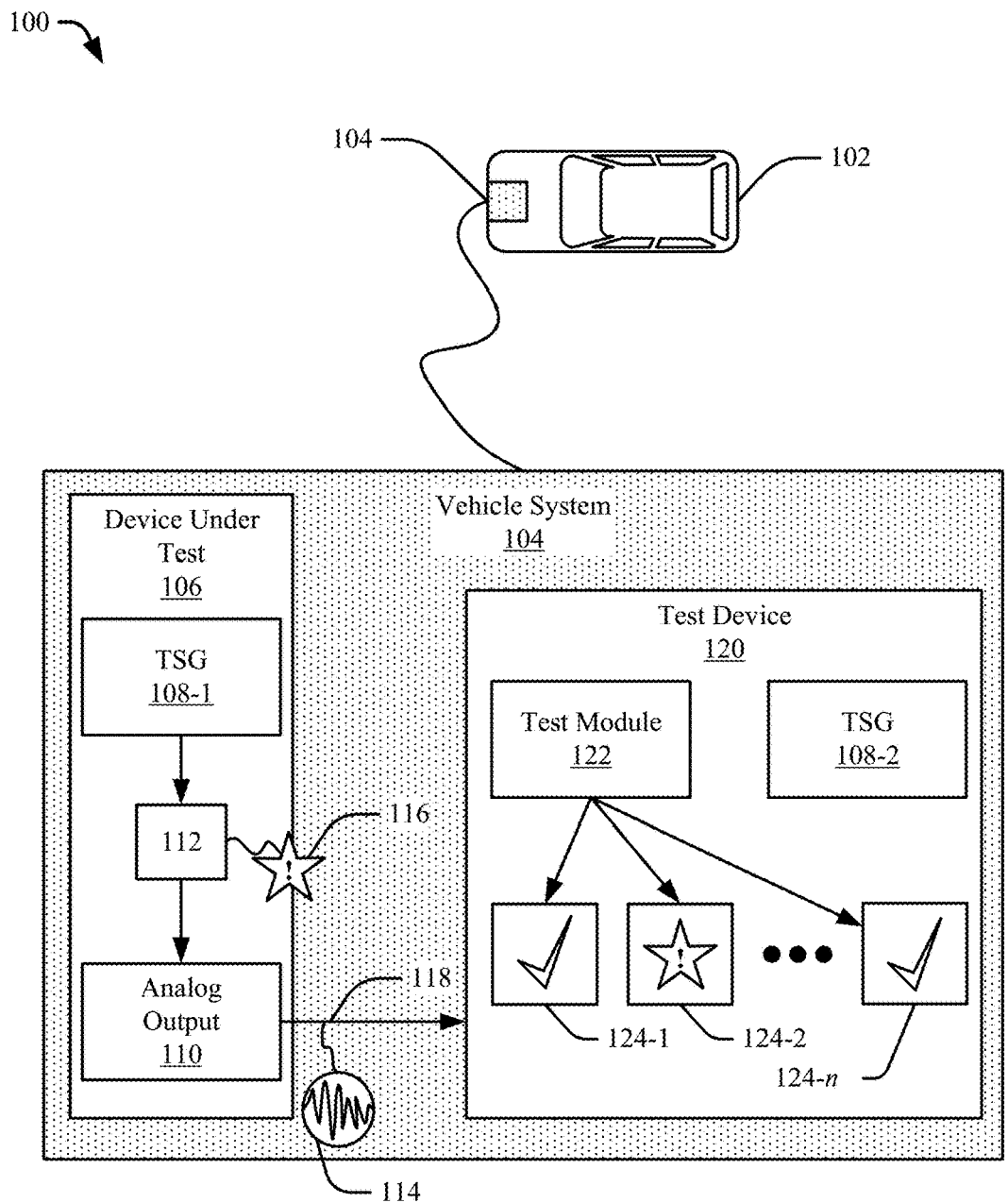
FIG. 1 illustrates a conceptual diagram of an environment for a vehicle system configured to perform integrity tests for mixed analog digital systems, in accordance with techniques of this disclosure.

Vehicle systems are equipped with complex computer systems to make driving easier and more enjoyable; ensuring reliability of their functionality is important. Digitized audio information may be propagated within these systems from analog outputs as analog signals or sounds. Driving alerts, chimes, announcements, phone calls, entertainment content, and the like, are examples of information that is digitally transmitted before conversion and output on analog paths. These digital transmissions can introduce transient errors in the information, which can propagate at intermittent or unpredictable times. Transient errors are observable in an audio signal as audio skips, or popping/cracking sounds, may be caused by errors in a digitized sequence of information received at an analog output, or may occur because of unexplained glitches or duplicate reads from a buffer. Errors in an audio output can be unpleasant to a driver of a car, additionally, errors can impact driving safety if they cause loud sounds or are able to corrupt other simultaneous warnings (e.g., chimes or announcement). This can be especially important in self-driving vehicles that are configured to instruct an operator when the driver is to resume manual control. Failure to heed to an audible instruction causes a self-driving vehicle to pull over as a safety precaution, for instance.

Expensive and time consuming checks can be performed by conducting physical tests to evaluate long term performance. Several days of computer simulation, and several months or years of real-world on-vehicle testing may be required to finish checking and verifying operation with sufficient confidence to release it into a product. Some existing techniques for checking quality of audio outputs in a test or engineering development cycle of a vehicle typically involve checking the big six parameters, including level, frequency response, total harmonic distortion (THD), phase, cross talk, and signal to noise ratio (SNR). Each of these checks bears a risk that transient errors are not found and therefore, not debugged during development and test. Even if some of these existing checks are passed, the vehicle system remains prone to never-before-observed transient errors corrupting audio for an end user of the vehicle.

Other ways to test continuous, error free propagation of a digital transmission is known from telecommunication, in which a test signal is transmitted and compared on reception. Often used is a pseudo random bit sequence (PRBS) produced by a PRNG as the test signal. Conducting such tests in an end to end digital system can identify transient errors. However, these techniques are not applicable to a large distributed system where access to a digital transmission path is not available. Such test would find this described transient errors, but they are not practically suited because other than in some specialized systems there is typically no easy access to the digital transmissions, unlike in telecommunications. As such, in a mixed digital and analog system distributed at different parts of a vehicle, existing techniques are not suitable for checking whether transient errors are caused in a digital transmission or due to an analog path of an analog output. Existing integrity checks for digital systems are not useful for mixed digital and analog systems and may not be suitable for replacing long term on-vehicle reliability tests. Furthermore, the described techniques enable the identification of transient errors that appear intermediately over time in the analog output, and static errors or faults that consistently reappear over time in the analog output.

Example Environment

FIG. 1 illustrates a conceptual diagram of an environment 100 for a vehicle system configured to perform integrity tests for mixed analog digital systems, in accordance with techniques of this disclosure. In the environment 100, a vehicle 102 is shown integrated with a vehicle system 104. The vehicle 102 can be any other application for a mixed digital and analog system. Non-vehicles (e.g., computers, servers, media players, sound equipment) can also include a mixed digital and analog system, such as the vehicle system 104, but for other purposes than for vehicle use. Therefore, the techniques of this disclosure may apply to other computer systems in other contexts.

The vehicle system 104 represents any mixed digital and analog system in which transient errors can propagate through digital transmissions and into an analog output. The vehicle system 104 may be implemented on a single computer card, as a single processing unit, as a system on chip, or in any other suitable architecture. Commonly referred to herein as audio systems, other types of systems can benefit from the described techniques. Any application in which a propagation path includes digital and analog forms can be checked using these techniques. The vehicle system 104 includes a device under test 106 and a test device 120.

The device under test 106 can be any component or element of the vehicle system 104 that transmits digital data for output using an analog device. The device under test 106 has an analog output 110 that is configured to receive a digital transmission 112 and produce an analog response 114 via an analog path 118. The device under test 106 may include a source of the digital transmission (e.g., an audio decoder, an audio encoder decoder) that decompresses digital audio data and then transmits the uncompressed digital data as the digital transmission 112 to the analog output 110 (e.g., a speaker device, a microphone), from which it is converted into an analog signal (e.g., sound).

Although shown as part of the same vehicle system 104 as the device under test 106, the test device 120 may exist on different hardware, or outside the vehicle 102. The test device 120 is configured to check integrity of digital transmissions from the device under test 106 without any invasive probing or procedures to the digital transmission 112 itself. The test device 120 is configured to check integrity of the digital transmission 112 from information obtained via the analog output 110 of the vehicle system 104 itself. The test device 120 may have an interface inside the vehicle 102 (e.g., a sound card input connected to the analog output 110 or other speaker of the vehicle system 104, a microphone) and may execute the integrity check from a remote workstation that executes the functionality of the test device 120 from outside the vehicle 102.

In some examples, the test device 120 is configured to check the integrity of the digital transmission 112 while the vehicle system 104 is operational and in use. This is due in part because no direct probe of the digital transmission 112 is performed. For instance, an onboard controller of the vehicle can initiate an integrity check via a software routine by calling on the test device 120 embedded in the vehicle 102. Still in some examples, the test device 120 is additionally, or alternatively, configured to check the integrity while the vehicle system is non-operational, under maintenance, or parked. Development and engineering is made easier because the digital transmission 112 can be checked in an automated fashion that does not require an expensive test bench or road test to check the performance of the vehicle system 104 under a seemingly endless possible set of environmental conditions. Further, a mechanic workstation, a charging station, a filling pump, or other off-vehicle device can instead initiate a similar integrity check with a remote terminal connection to the test device 120.

To enable the integrity check with the test device 120, the device under test 106 includes a test signal generator (TSG) 108-1. The TSG 108-1 can be a PRNG or other test sequence generator that can reliably produce a same, consistent test signal, and in the case of a PRBS, with a seemingly noisy or random pattern. During the digital transmission 112, the TSG 108-1 injects a test signal (e.g., a PRBS) into the digital transmission 112 for output by the analog output 110. The source of the digital transmission 112 may include the TSG 108-1, or the TSG 108-1 may have an input to the digital path of the digital transmission 112 to inject a test signal within the digital transmission 112 without requiring any modification to an audio decoder or other source.

The test device 120 includes or has access to a corresponding TSG 108-2 that uses a same test signal generation function as the TSG 108-1. For example, if the TSG 108-1 is a PRNG, the TSG 108-2 is also a PRNG with a same polynomial or randomization algorithm as the PRNG 108-1. This enables the TSG 108-2 to reproduce the same test signal that the TSG 108-1 produces, when given the same input parameters. The TSG 108-1 and the TSG 108-2 are matched to enable non-intrusively testing of the digital transmission 112 from analyzing only the analog output 110.

Rather than perform exhaustive physical test or achieve unusable results from applying purely digital testing techniques, a test module 122 of the test device 120 checks the analog output 110 for errors 116 (e.g., transient errors, static errors) that are attributed to the digital transmission 112, or any other digital transmissions that can occur anywhere within the device under test 106. The test module 122 estimates the test signal generated by the TSG 108-1, using an output from the TSG 108-2 as the initial test signal estimate. However, the test module 122 further compensates the test signal estimate using a linear transfer function of a digital path of the digital transmission 112 and an analog path of the analog output 110. In this way, the test module 122 compensates the test signal estimated for the linear transfer function between the digital transmission 112 and the analog path 118. The estimated test signal can be compared against the analog response 114 to determine whether the digital transmission 112 was free from transient errors based on whether the test signal estimated with the TSG 108-2 is identifiable from the analog response 114 (an analog signal, an audio signal based on the digital transmission 112) on the analog path 118 of the analog output 110.

Based on whether a measured signal corresponds to the compensated estimated test signal (e.g., within some acceptable degree of tolerance), the test module 122 can determine whether the digital transmission 112 propagated errors or performed as expected. To this end, if unable to identify the estimated test signal, the result of this check is that it can pinpoint when errors are appearing due to the digital transmission 112. This may aid in debugging and engineering design to obtain confidence that errors are not appearing because of the analog output 110.

An indication of whether any errors are introduced by the digital transmission can be reported as an indication 124, for instance, graphically, audibly, or via a log (e.g., as indication 124-1, indication 124-1, . . . indication 124-n). The test module 122 may output an indication 124-2 in case an error is observed. Else, if no errors are detected, the test module 122 may output an indication 124-1 through 124-n to indicate that the vehicle system 104 is operating as expected.

In this way, debugging an installation of the vehicle system 104 becomes easier, and therefore takes less time and is less expensive. Also, achieving reliability of a mixed analog and digital transmission system becomes less of a challenge and when obtained, it can be verified with greater confidence.

Example Architecture of Test Device

Figure 2:
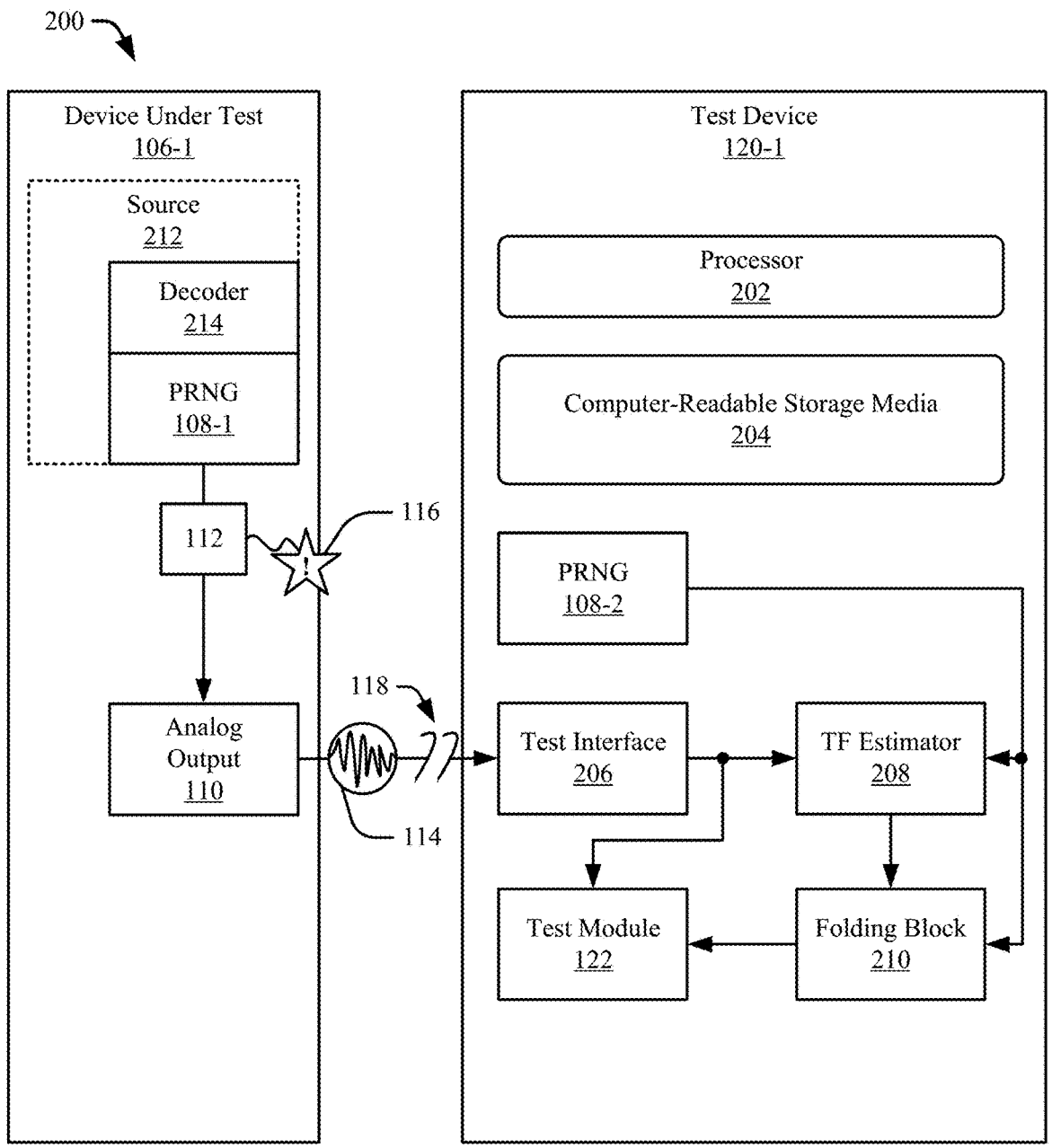
FIG. 2 illustrates a conceptual diagram of a vehicle system configured to perform integrity tests for mixed analog digital systems, in accordance with techniques of this disclosure.

FIG. 2 illustrates a conceptual diagram of a vehicle system 200 configured to perform integrity tests for mixed analog digital systems, in accordance with techniques of this disclosure. The vehicle system 200 is an example of the vehicle system 104. Included is a device under test 106-1, and a test device 120-1.

The device under test 106-1 includes a source 212 for the digital transmission 112. The source 212 generates the digital information that is received by the analog output 110 to elicit the analog response 114, or sound. The source 212 may include a decoder 214 configured convert compressed digital information into uncompressed audio information that is suitable for playback from the analog output 110. The decoder 214 may include the TSG 108-1, which is shown as a PRNG 108-1, and may be a separate component of the source 212. The PRNG 108-1 is configured to inject a test signal in the digital transmission 112 output by the decoder 214. That is, the PRNG 108-1 and the decoder 214 is further configured to inject the test signal into the digital transmission along with the uncompressed audio information.

The test device 120-1 includes a processor 202 and a computer-readable storage media (CRM) 204 that stores instructions, which when executed by the processor 202, implement the functions associated with the test module 122, the TSG 108-2, which is sown as a PRNG 108-2, a test interface 206, a transfer function estimator 208, and a folding block 210. The processor 202 can be any processing device, processing unit, controller, or other computer. The CRM 204 can be any type of computer storage suitable for maintaining instructions that can be executed by the processor 202 to implement the functions of the test device 120-1.

The test interface 206 receives the analog response 114 from the analog path 118 (e.g., a signal in air). The test interface 206 can be a sound card input to the test device 120, which can receive an output from the analog output 110 (or other speaker of the vehicle system 104), or in some cases, rely on a microphone input to the test interface 106. In this way, the test device 120-1 does not impact the digital transmission 112 by not having to directly probe the device under test 106; this indirect check improves confidence that the digital transmission 112 and not something else is the focus of the integrity check.

The PRNG 108-2 is tied to the transfer function estimator 208 and the folding block 210. These three logical blocks or units, use the PRNG 108-2 to measure the linear transfer function of the digital path of the digital transmission 112 and the analog path 118 of the analog output 110.

The transfer function estimator 208 obtains a test signal estimated by the PRNG 108-2. The transfer function estimator 208 then determines the linear transfer function of the digital transmission 112 and the analog path 118, combined. This linear transfer function is computed by the transfer function estimator 208 from estimating, using a cross correlation function, a phase correlation between a source of the digital transmission 112 (e.g., the decoder 214) and the first PRNG 108-1. The cross correlation can be set based on predetermined measurements of the device under test 106-1.

The folding block 210 configures the processor 202 to estimate the test signal by compensating the PRNG 108-2 for the linear transfer function of the digital path and the analog path combined, by folding the impulse response with the second PRNG. The folding block 210 also obtains the test signal estimated by the PRNG 108-2, as well as the phase correlation computed by the transfer function estimator 208. From these inputs, the folding block 210 derives an impulse response 114 of the analog output 110 associated with the test signal estimated by the transfer function estimator 208 and the PRNG 108-2.

From this, the test module 122 can deduce a realistic position in a time sequence of the digital transmission 112 at which to obtain a measurement of the analog response 114 of the analog output 110 from the analog path 118. The test module 122 obtains a measured analog response and compares it with the test signal estimated by the folding block 210 to determine whether errors are appearing in the digital transmission 112 itself.

For examples, the test module 122, when loaded from the CRM 204 and executed by the processor 202, can determine whether the test signal estimated is identifiable from the analog path compare the measured response of the analog output obtained from the test interface 206, with the test signal estimated by the folding block 210. The test module 122 determines the digital path of the digital transmission 112 to be free of errors, including transient errors or static errors, when the test signal estimated is approximately identifiable from the measured response.

In practice, the test signal injected by the PRNG 108-1 satisfies a signal tolerance level such that the test signal estimated is identifiable in the digital transmission 112 that also appears in the measured response. The signal tolerance level need to vary (e.g., increase or decrease), to adjust for variations in the vehicle system 104, the unit under test 106, and components used to implement the test device 120 as less precise modeling may fail to account for additional crosstalk that impacts the analog response 114.

The test module 122 determines the digital path of the digital transmission 112 to have errors when the test signal estimated is not identifiable from the measured response. Any significant failure in the digital transmission 112, like bit errors in a higher value bit or dropped frames or dropped buffers cause such significant deformation in the analog response that these, in addition to transient errors, can be detected In this way, an unintrusive way to check integrity of a mixed analog digital transmission system is provided by the test device 120. The vehicle 102 may include the test device 120 within the vehicle system 104, or may interface with the test device 120, which can execute outside the vehicle 102 (e.g., during engineering or test, on a workstation in a garage).

Example Process

Figure 3:
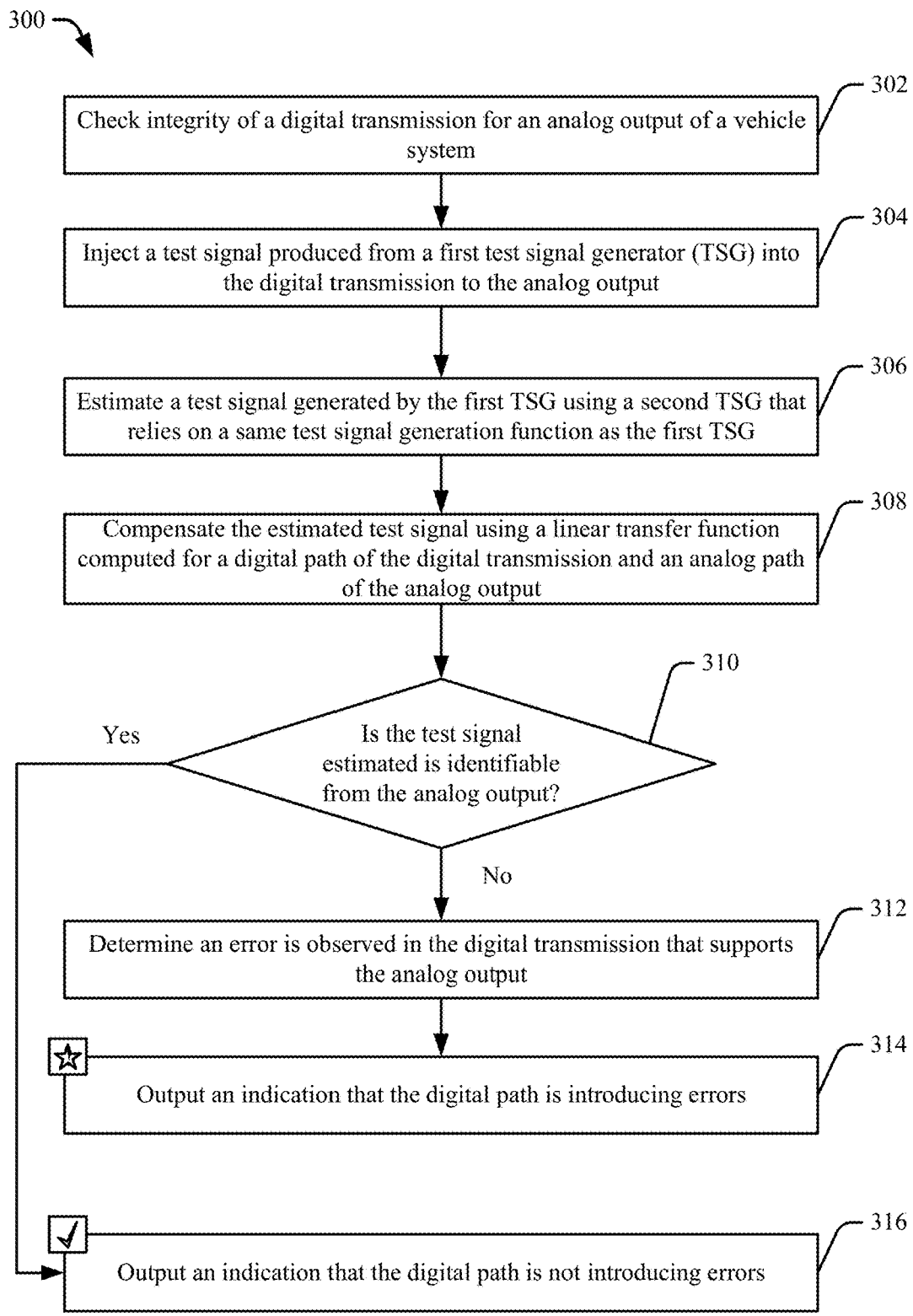
FIG. 3 illustrates a flow chart of processes for performing integrity tests for mixed analog digital systems, in accordance with techniques of this disclosure.

FIG. 3 illustrates a flow chart of processes 300 for performing integrity tests for mixed analog digital systems, in accordance with techniques of this disclosure. The process 300 may be performed by the test device 120, the unit under test 106, or a combination of the two. The steps of the process 300 may be repeated, rearranged, omitted, or otherwise modified depending on application. For ease of description, the process 300 is performed in the context of elements of FIG. 1.

At 302, integrity of a digital transmission for an analog output of a vehicle system is checked. For example, the test module 122 of the test device 120 obtains the analog response 114 from the analog path 118 out of the analog output 110 to check integrity of the digital transmission 112 occurring within the device under test 106.

At 304, a test signal produced from a first TSG is injected into the digital transmission to the analog output. For example, the PRNG 108-1 inputs a test signal in the digital transmission 112 that is sent to the analog output 110.

At 306, a test signal generated by the first TSG is estimated using a second TSG that relies on a same test signal generation function as the first TSG. For example, the PRNG 108-2 is a mirror component to the PRNG 108-1 and able to reproduce the same test signal that the PRNG 108-1 injects in the digital transmission 112 from executing the same polynomial as the PRNG 108-1.

At 308, the test signal estimated by the second TSG is compensated using a linear transfer function computed for a digital path of the digital transmission and an analog path of the analog output. For example, the test module 122 determines the linear transfer function by estimating, using a cross correlation function, a phase correlation between a source of the digital transmission 112 (e.g., an audio decoder of the device under test 106) and the first TSG. Based on the phase correlation, the test module 122 can derive an impulse response of the analog output 110 associated with the test signal estimated. In other words, the test module 122 can determine more accurately how the test signal is likely to appear if it is free from error when measured from the analog response 114, given known relationships (linear transfer function) of the source and the analog output 110.

At 310, whether the test signal estimated is identifiable from the analog output is determined. For example, the test module 122 can cross corelate, the test signal estimated, with the analog output 110, to determine a realistic position in a time sequence of the digital transmission 112 at which to obtain a measured response of the analog output 110 from the analog path 118. Then, from comparing the measured response of the analog output 110 with the test signal estimated, the test module 122 may determine the digital path of the digital transmission to be free of errors when the test signal estimated is approximately identifiable from the measured response (see Yes branch out of 310) and may determine the digital path of the digital transmission 112 to have errors when the test signal estimated is not identifiable from the measured response (see No branch out of 310).

If no errors are identified, at 316, an indication that the digital path is not introducing errors is output. For example, the test module 122 may cause the test device 120 to output a graphical user interface that provides confidence in the digital transmission 112.

Otherwise, if errors are identified, at 312, it is determined that the digital path is introducing errors. At 314, an indication that the digital path is introducing errors is output. For example, the test module 122 may cause the test device 120 to output a graphical user interface that provides an indication of which digital path of the vehicle system 104 includes errors or is introducing errors in the digital transmission 112.

Example Application for Test Device

Figure 4:
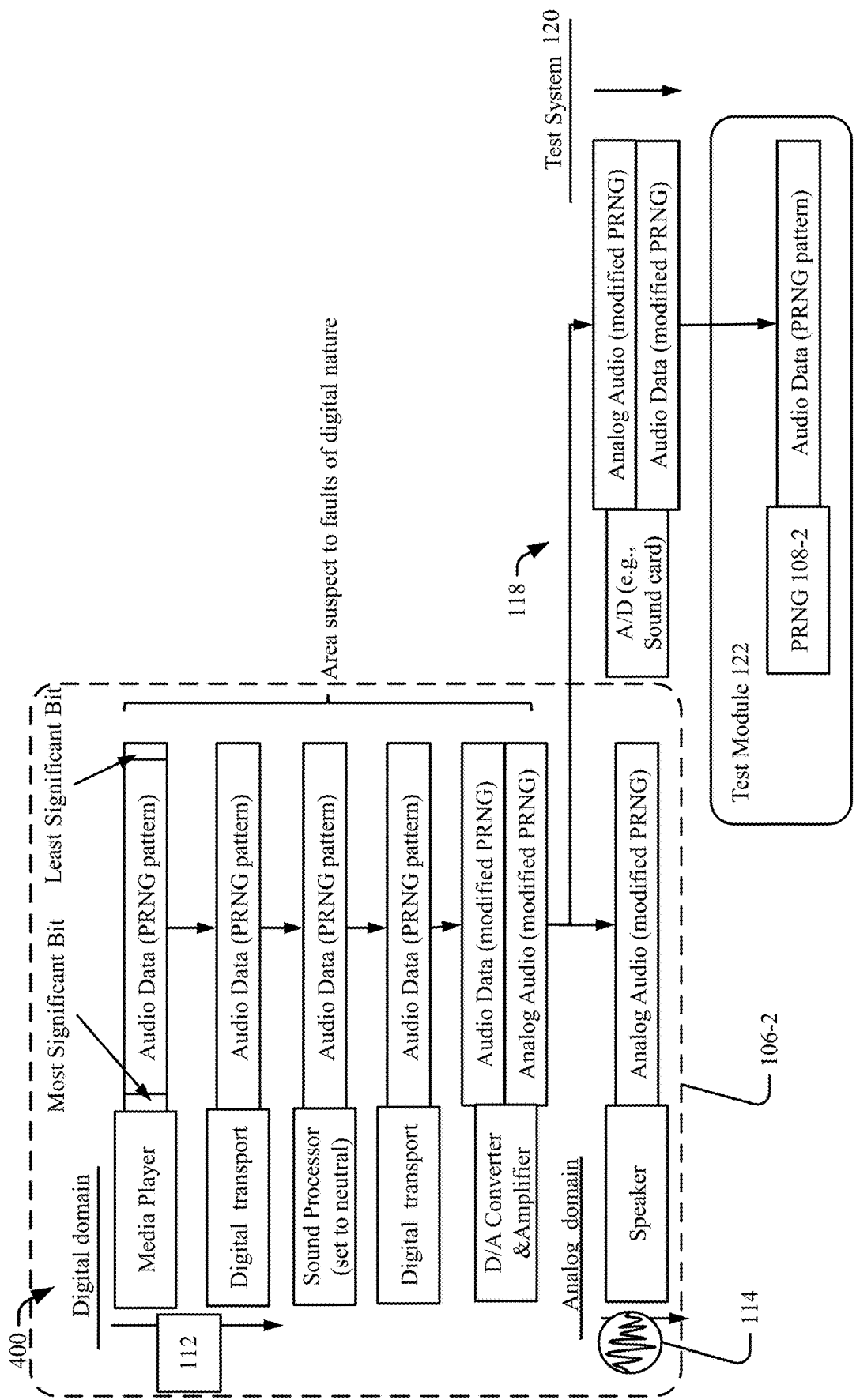
FIG. 4 illustrates a conceptual diagrams of an example data flow for using integrity tests for mixed analog digital systems, in accordance with techniques of this disclosure.

FIG. 4 illustrates a conceptual diagram 400 of an example data flow for using integrity tests for mixed analog digital systems, in accordance with techniques of this disclosure. FIG. 4 shows an application for the test device 120, which can easily connect to a device under test 106-2 to verify absence of sporadic digital faults in the digital transmission 112.

A Media player or dedicated test pattern player plays a test signal (e.g., PRNG pattern of a given polynomial). A digital transportation mechanism conducts this data in real time thru the device under test 106-2 and to a processing stage executed by a sound processor.

In the processing stage (e.g., an equalizer) the sound processor sets the audio data to a neutral tuning during the test. Another transportation system delivers the audio data to a digital to analog converter and amplifier, in real time The digital to analog converter changes the digital transmission 112 and embedded test signal to an analog signal or analog response 114. According to principal theory of digital to analog conversion theory, the analog response 114 is modified by a linear time invariant transfer function, which is not specified, or known to the test device 120.

The test system receives the analog response 114 via an analog to digital converter (e.g., a soundcard input of the test system 120) to digitalize the audio signal 114 for evaluation for errors. At the test module 122, a signal modification of the test signal estimated with the linear transfer function happens. The test module 122 has a way to characterize and compensate for the linear transfer function without direct access to the test signal injected by the device under test 106.

Further Application for Test Device

Figure 5:
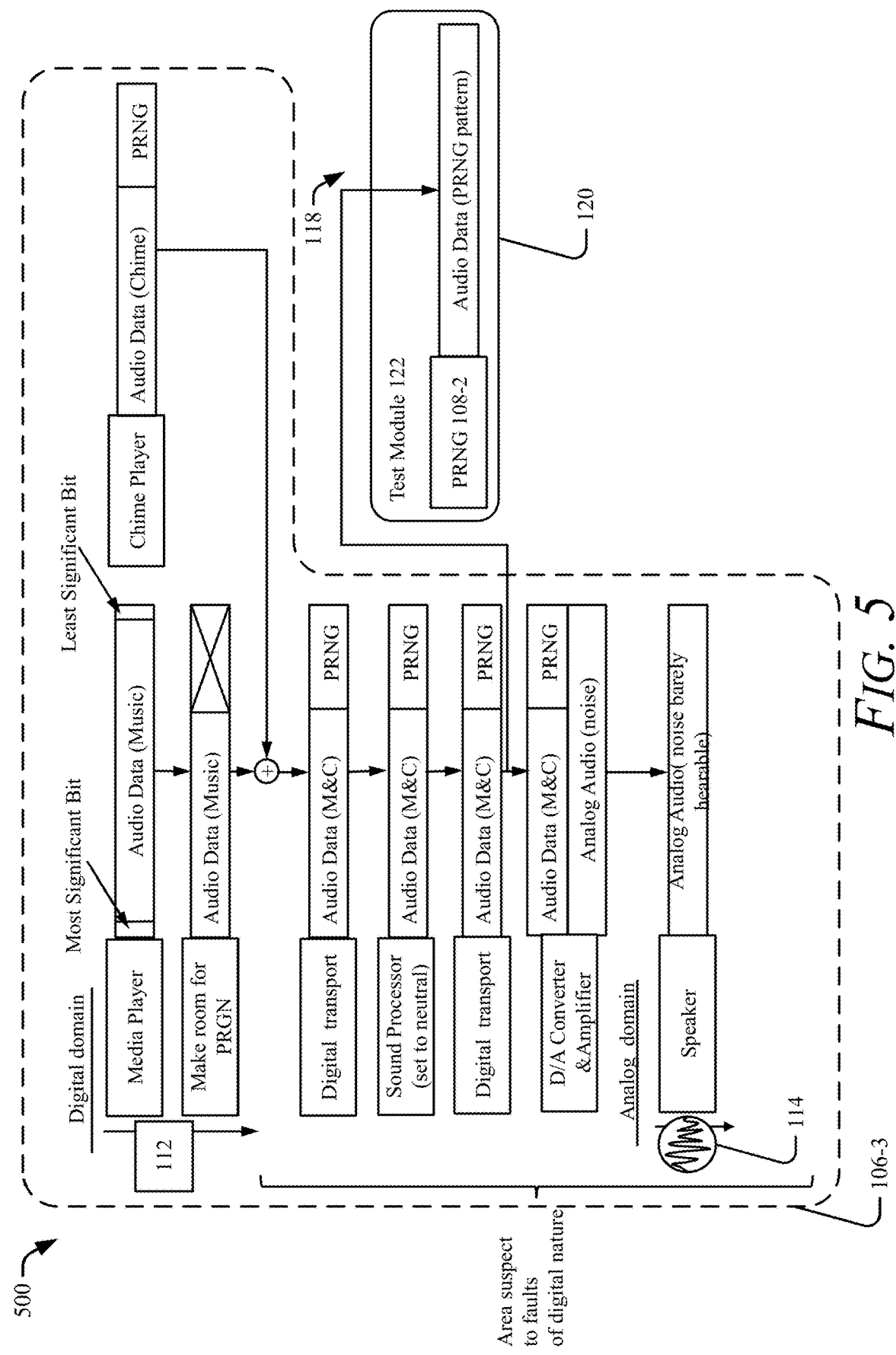
FIG. 5 illustrates a conceptual diagrams of an example data flow for using integrity tests for mixed analog digital systems, in accordance with techniques of this disclosure.

FIG. 5 illustrates a conceptual diagram 500 of an example data flow for using integrity tests for mixed analog digital systems, in accordance with techniques of this disclosure. FIG. 5 shows an application for the test device 120, which can connect to a device under test 106-3 to verify absence of transient errors or other sporadic digital faults in the digital transmission 112. In general, as the nature of the test signal is a neutral noise sound, a subset of the bits, e.g., the four topmost bits of the PRNG can be utilized to replace the real four least significant bits of a music channel, and an analog sampled feedback of the outgoing channel can test this PRNG fraction for existence.

A Media player plays the entertainment audio content, like music. A warning chime player plays a warning message, but the lower significant bits are replaced by a PRNG of a particular polynomial. As the PRNG will acoustically sound like white noise and only the lower bits are used, it can be injected as an almost inaudible noise floor to the chime.

From the playing music, the least significant bits are removed to make room for the test pattern. Both, the music, and the chime can be added to one audio signal, and the unchanged PRNG sequence can be in the lower significant bits.

A transportation mechanism conducts this data in real time thru the computer system to a processing stage. Another transportation system delivers the audio data to an audio coder decoder, in real time At that point, the signal can be tapped at the path 118 and given to the test module 122 to confirm fault free playback of the chime. This is done by the test module 122 removing all upper bits, carrying the mix of music and chime, and extracting only the test pattern (PRNG) and used it in the test module 122 evaluation of whether the digital transmission 112 is error free. The linear transfer function compensation is performed to compensate for filters and volume settings of the processing stage (e.g., the equalizer).

Think of an example where a strong rattling sound is added when the lane departure warning of the vehicle recognized that the vehicle drifts over the lane boundary. Such sound shall suggest to the driver, the wheel are on uneven ground as it would be real if one gets to some gravel aside to the road. It is a nice way of alerting the driver without interrupting all other music. Such a warning needs to be well supervised, so in case it fails to play a safe state can be triggered, e.g., a simple warning sound generator on an independent speaker may engage. The suggested techniques are similar to injecting a watermark into the wanted sound, which has the acoustical characteristics of white noise and that can be tested for presence in an easy way to check for errors that are too seldom to be apparent from test.

Additional Examples

Example 1. A method, comprising: checking integrity of a digital transmission for an analog output of a system; and outputting an indication of whether any errors are introduced due to a digital path of the digital transmission, wherein checking the integrity of the digital transmission includes: estimating a test signal, produced from a first test signal generator (TSG) of the system and injected into the digital transmission for inclusion in the analog output, using a second TSG that relies on a same test signal generation function as the first TSG and compensating for a linear transfer function of the digital path and an analog path of the analog output combined; and determining whether the test signal estimated is identifiable from the analog path of the analog output to determine whether the digital path of the digital transmission is free from errors.

Example 2. The method of example 1, wherein determining whether the test signal estimated is identifiable from the analog path includes: cross corelating the test signal estimated with the analog output to determine a realistic position in a time sequence of the digital transmission at which to obtain a measured response of the analog output from the analog path; comparing the measured response of the analog output with the test signal estimated; determine the digital path of the digital transmission to be free of errors when the test signal estimated is approximately identifiable from the measured response; and determining the digital path of the digital transmission to have errors when the test signal estimated is not identifiable from the measured response.

Example 3. The method of example 2, wherein the first TSG comprises a first pseudo random bit generator (PRNG) and the test signal comprises a first PRNG that is injected by the first PRNG at least above a signal tolerance level such that the test signal estimated is identifiable in the measured response, and the second TSG comprises a second PRNG that relies on a same polynomial function as the first PRNG.

Example 4. The method of any other example, further comprising determining the linear transfer function of the digital path and the analog path combined by: estimating, using a cross correlation function, a phase correlation between a source of the digital transmission and the first TSG; and deriving, based on the phase correlation, an impulse response of the analog output associated with the test signal estimated.

Example 5. The method of example 4, estimating the test signal by compensating the second TSG for the linear transfer function of the digital path and the analog path combined includes folding the impulse response with the second TSG.

Example 6. The method of example 4 or 5, wherein the test signal is injected into the digital path of the digital transmission by the source or the first TSG.

Example 7. The method of any of examples 4-6, wherein the source is separate from the first TSG.

Example 8. The method of any of examples 4-6, wherein the source comprises the first TSG.

Example 9. The method of any of examples 4-8, wherein the source comprises an audio decoder configured to output uncompressed audio information into the digital transmission.

Example 10. The method of example 9, wherein the source further comprises the first TSG and the audio decoder is further configured to inject the test signal into the digital transmission along with the uncompressed audio information.

Example 11. The method of any previous example, wherein the errors include transient errors that appear intermediately over time in the analog output.

Example 12. The method of any previous example, wherein the errors include faults that consistently reappear over time in the analog output.

Example 13. The method of any previous example, wherein the analog output comprises a speaker device and the analog path comprises an audio signal based on the digital transmission that is sent to a soundcard input of the test device.

Example 14. The method of any previous example, wherein the system comprises a vehicle system installed on a vehicle, the device is separate from the vehicle, and the at least one processor is configured to check the integrity while the vehicle system is operational and in use.

Example 15. The method of any previous example, wherein the system comprises a vehicle system installed on a vehicle, the device is separate from the vehicle, and the at least one processor is configured to remotely check the integrity while the vehicle system is non-operational, under maintenance, or parked.

Example 16. The method of any previous example, wherein the device comprises the system.

Example 17. A computer-readable media comprising instructions that, when executed, cause computer hardware components of a vehicle system to perform the method of any previous example.

Example 18. The computer-readable media of example 17, wherein the vehicle system comprises the computer hardware components, the vehicle system and the computer hardware components are part of the vehicle, and the computer hardware components are configured check the integrity while the vehicle system is operational and in use.

Example 19. The computer-readable media of example 17, wherein the vehicle system is part of the vehicle, the computer hardware components are separate from the vehicle and the vehicle system, and the computer hardware components are configured check the integrity while the vehicle is non-operational, in a maintenance mode, unoccupied, or parked.

Example 20. A device comprising at least one processor configured to perform the method of any previous example.

Example 21. A system comprising means for performing the method of any previous example.

Example 22. A system comprising: a device under test comprising: an analog output; a digital path to the analog output; a source configured to produce a digital transmission on the digital path for the analog output; and a first test signal generator configured to inject a test signal in the digital path of the digital transmission; and a test device comprising: a second TSG that relies on a same test generation function as the first TSG; and at least one processor configured to check of the digital path of the device under test by: estimating, using a second TSG, the test signal produced from the first TSG; and compensating the test signal estimated for a linear transfer function of the digital path and an analog path of the analog output combined; and determining whether the test signal estimated is identifiable from the analog path of the analog output to determine whether the digital path of the digital transmission is free from errors; and output an indication of whether any errors are introduced due to a digital path of the digital transmission.

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the scope of the claims. Problems associated with digital transfers of information can occur in other systems besides automobile, truck, and vehicle systems. Therefore, although described as a way to improve safety and reliability of a vehicle system, the techniques of the foregoing description can be applied to other systems that would benefit from a fast integrity check of a digital transfer of information.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A vehicle system comprising:
    a device under test comprising:
        a source configured to produce a digital transmission;
        a first test signal generator (TSG) configured to:
            produce a first test signal based on a test generation function; and
            inject the first test signal into the digital transmission;
        a digital path configured to transfer the digital transmission from the first TSG to an analog output of the device under test; and
        the analog output configured to output an analog response along an analog path based on the digital transmission; and
    a test device comprising:
        at least one processor configured to:
            receive, from the device under test, the analog response;
            receive, from a second TSG of the test device, a second test signal based on the test generation function;
            compensate the second test signal using a linear transfer function of a combination of the digital path and the analog path of the device under test to produce an estimated test signal;
            determine whether the estimated test signal is identifiable from the analog response; and
            output an indication of whether any errors have been introduced by the digital path of the device under test based on whether the estimated test signal is identifiable from the analog response.

2. The vehicle system of claim 1, wherein the processor of the test device is further configured to determine whether the estimated test signal is identifiable from the analog response by:
    cross corelating the estimated test signal with the analog response to determine a position in a time sequence at which to obtain a portion of the analog response; and
    comparing the portion of the analog response with the estimated test signal.

3. The vehicle system of claim 2, wherein the indication indicates that errors have not been introduced by the digital path of the device under test responsive to the processor of the test device determining that the estimated test signal is identifiable from the portion of the analog response.

4. The vehicle system of claim 2, wherein the indication indicates that errors have been introduced by the digital path of the device under test responsive to the processor of the test device determining that the estimated test signal is not identifiable from the portion of the analog response.

5. The vehicle system of claim 1, wherein:
    the first TSG comprises a first pseudo random bit generator (PRNG) and the first test signal comprises a first sequence of bits; and
    the second TSG comprises a second PRNG that relies on a same polynomial function as the first PRNG to produce a second sequence of bits that is similar to the first sequence of bits.

6. The vehicle system of claim 1, wherein the processor of the test device is further configured to:
    determine the linear transfer function of the digital path and the analog path of the device under test by:

estimating, using a cross correlation function, a phase correlation between the source and the first TSG of the device under test; and deriving, based on the phase correlation, an impulse response.

7. The vehicle system of claim 6, wherein the processor of the test device is further configured to compensate the second test signal by folding the impulse response with the second test signal.

8. The vehicle system of claim 1, wherein the source of the device under test is separate from the first TSG of the device under test.

9. The vehicle system of claim 1, wherein the source of the device under test comprises the first TSG of the device under test.

10. The vehicle system of claim 1, wherein the source of the device under test comprises an audio decoder configured to output uncompressed audio information.

11. The vehicle system of claim 1, wherein the errors include at least one of (i) transient errors that appear intermittently over time in the analog response or (ii) faults that consistently reappear over time in the analog response.

12. The vehicle system of claim 1, wherein the analog output of the device under test comprises a microphone or speaker device.

13. The vehicle system of claim 1, wherein the analog output of the device under test is comprised by a digital to audio analog converter of the device under test.

14. The vehicle system of claim 1, wherein:
the device under test is installed on a vehicle;
the test device is separate from the vehicle; and
the processor of the test device is configured to operate while the vehicle is operational and in use.

15. The vehicle system of claim 1, wherein:
the device under test is installed on a vehicle;
the test device is separate from the vehicle; and
the processor of the test device is configured to operate while the vehicle is non-operational, under maintenance, or parked.

16. A method comprising:
producing, by a source of a device under test, a digital transmission;
producing, by a first test signal generator (TSG) of the device under test, a first test signal based on a test generation function;
injecting, by the first TSG of the device under test, the first test signal into the digital transmission;
transmitting, via a digital path of the device under test that is between the first TSG of the device under test and an analog output of the device under test, the digital transmission to the analog output of the device under test;
outputting, by the analog output of the device under test and via an analog path, an analog response based on the digital transmission;

receiving, by at least one processor of a test device, the analog response from the device under test;
receiving, by the processor of the test device and from a second TSG of the test device, a second test signal based on the test generation function;
compensating, by the processor of the test device, the second test signal using a linear transfer function of a combination of the digital path and the analog path of the device under test to produce an estimated test signal;
determining, by the processor of the test device, whether the estimated test signal is identifiable from the analog response; and
outputting, by the processor of the test device, an indication of whether any errors have been introduced by the digital path of the device under test based on whether the estimated test signal is identifiable from the analog response.

17. The method of claim 16, further comprising determining the linear transfer function of the digital path and the analog path of the device under test by estimating, using a cross correlation function, a phase correlation between the source and the first TSG of the device under test.

18. The method of claim 17, wherein the compensating the second test signal comprises folding an impulse response generated from the cross correlation function with the second test signal.

19. The method of claim 16, wherein the analog output of the device under test is comprised by a digital to analog converter of the device under test.

20. A test device comprising:
at least one processor configured to:
receive, from an analog path of a device under test, an analog response, a portion of the analog response corresponding to a first test signal that has been introduced into a digital transmission that has been propagated along a digital path of the device under test and converted to analog to form the analog response;
receive a second test signal that is formed by the test device based on a test generation function that is also used, by the device under test, to generate the first test signal;
compensate the second test signal using a linear transfer function of a combination of the digital path and an analog path of the device under test to produce an estimated test signal;
determine whether the estimated test signal is identifiable from the analog response; and
output an indication of whether any errors have been introduced by the digital path of the device under test based on whether the estimated test signal is identifiable from the analog response.

* * * * *